United States Patent
Tomiga et al.

(10) Patent No.: US 9,202,709 B2
(45) Date of Patent: Dec. 1, 2015

(54) POLISHING LIQUID FOR METAL AND POLISHING METHOD USING THE SAME

(75) Inventors: Takamitsu Tomiga, Shizuoka-ken (JP); Tomoo Kato, Shizuoka-ken (JP); Tadashi Inaba, Shizuoka-ken (JP); Masaru Yoshikawa, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 403 days.

(21) Appl. No.: 12/399,984

(22) Filed: Mar. 9, 2009

(65) Prior Publication Data

US 2009/0239380 A1 Sep. 24, 2009

(30) Foreign Application Priority Data

Mar. 19, 2008 (JP) .................................. 2008-070895

(51) Int. Cl.
C09K 13/06 (2006.01)
H01L 21/321 (2006.01)
C09G 1/02 (2006.01)
C09K 3/14 (2006.01)

(52) U.S. Cl.
CPC .............. *H01L 21/3212* (2013.01); *C09G 1/02* (2013.01); *C09K 3/1454* (2013.01); *C09K 3/1463* (2013.01)

(58) Field of Classification Search
None
See application file for complete search history.

(56) References Cited

U.S. PATENT DOCUMENTS

| | | | | | |
|---|---|---|---|---|---|
| 3,408,307 | A | * | 10/1968 | Troscinski et al. | 252/394 |
| 4,710,228 | A | * | 12/1987 | Seaborne et al. | 106/218 |
| 4,944,836 | A | | 7/1990 | Beyer et al. | |
| 6,355,075 | B1 | * | 3/2002 | Ina et al. | 51/308 |
| 6,375,545 | B1 | * | 4/2002 | Yano et al. | 451/36 |
| 6,730,644 | B1 | * | 5/2004 | Ishikawa et al. | 510/175 |
| 6,794,289 | B2 | * | 9/2004 | Hudson | 438/691 |
| 2004/0053499 | A1 | * | 3/2004 | Liu et al. | 438/689 |
| 2004/0134376 | A1 | * | 7/2004 | Hirano | 106/3 |
| 2005/0029491 | A1 | * | 2/2005 | Liu | 252/79.1 |
| 2005/0050803 | A1 | * | 3/2005 | Amanokura et al. | 51/309 |

FOREIGN PATENT DOCUMENTS

| | | |
|---|---|---|
| JP | 49-122432 | 11/1974 |
| JP | 2-278822 | 11/1990 |
| JP | 2001-127019 | 5/2001 |
| JP | 2001-279231 | 10/2001 |
| JP | 2002-538284 | 11/2002 |
| JP | 2003-507894 | 2/2003 |
| JP | 2007-073548 | 3/2007 |
| JP | 2007-227669 | 9/2007 |
| JP | 2007-242984 | 9/2007 |
| JP | 2008-091569 | 4/2008 |
| JP | 2008-306054 | 12/2008 |
| TW | 200802578 A | 1/2008 |

OTHER PUBLICATIONS

JPO, Translation, May 9, 2014, JPO, p. 1-29.*
Shadman, Environmental challenges in nanoelectronics manufacturing, 2012, Elsevier, p. 1-11.*
Song et al, Production of succinic acid by bacterial fermentation, 2006, Elsevier, Enzyme and Microbial Technology 39 (2006) 352-361, p. 352 (first page of article).*
GuideChem, Synonyms: Butanedioicacid, Sep. 7, 2014, GuideChem, p. 1.*
Journal of the Electrochemical Society, 1991, vol. 138, No. 11, pp. 3460 to 3464.
Journal of the Electrochemical Society, 2000, vol. 147, No. 10, pp. 3907 to 3913.
Partial English language translation of the following: Office action dated Feb. 26, 2013 from the Japanese Patent Office in a Japanese patent application corresponding to the instant patent application. This office action translation is submitted now in order to supplement the understanding of patent document JP 2007-227669, JP2007-073548 and JP2007-242984 which are cited in the office action and are being disclosed in the instant Information Disclosure Statement.
Partial English language translation of the following: Office action dated Nov. 21, 2013 from the Taiwanese Patent Office in a Taiwanese patent application corresponding to the instant patent application. This office action translation is submitted now in order to supplement the understanding of patent document TW200802578 which is cited in the office action and is being disclosed in the instant Information Disclosure Statement.
Partial English language translation of the following: Office action dated Feb. 18, 2014 from the Japanese Patent Office in a Japanese patent application corresponding to the instant patent application. This office action translation is submitted now in order to supplement the understanding of patent document JP 2008-306054 which is cited in the office action and is being disclosed in the instant Information Disclosure Statement.
Partial English language translation of the following: Office action dated Sep. 3, 2013 from the Japanese Patent Office in a Japanese patent application corresponding to the instant patent application. This office action translation is submitted now in order to supplement the understanding of patent document JP2008-091569 which are cited in the office action and are being disclosed in the instant Information Disclosure Statement.
Korean Office action dated Mar. 9, 2015, with the partial English translation corresponding to the instant patent application.

* cited by examiner

*Primary Examiner* — Nadine Norton
*Assistant Examiner* — David Cathey, Jr.
(74) *Attorney, Agent, or Firm* — SOLARIS Intellectual Property Group, PLLC

(57) ABSTRACT

A liquid for polishing a metal is provided that is used for chemically and mechanically polishing a conductor film including copper or a copper alloy in production of a semiconductor device, and a polishing method using the metal-polishing liquid is also provided. The liquid includes: (a) colloidal silica particles having an average primary particle size of from 10 nm to 25 nm and an average secondary particle size of from 50 nm to 70 nm; (b) a metal anticorrosive agent; (c) at least one compound selected from the group consisting of a surfactant and a water-soluble polymer compound; (d) an oxidizing agent; and (e) an organic acid.

9 Claims, No Drawings

POLISHING LIQUID FOR METAL AND POLISHING METHOD USING THE SAME

CROSS-REFERENCE TO RELATED APPLICATION

This application claims priority under 35 USC 119 from Japanese Patent Application No. 2008-070895, the disclosure of which is incorporated by reference herein.

BACKGROUND OF THE INVENTION

1. Field of the Invention

The present invention relates to a polishing liquid for polishing metals and a method of polishing using the same. In particular, the invention relates to a polishing liquid for metals, which is suitably used in production of semiconductor devices and to a method of polishing using the polishing liquid.

2. Description of the Related Art

In the development of semiconductor devices exemplified by semiconductor integrated circuits such as large scale integration circuits (hereinafter also referred to as "LSI circuits"), increased density and integration through refining and lamination of wirings have been demanded in recent years in order to decrease the size and increase the operation speed of semiconductor devices. For this purpose, various techniques such as chemical mechanical polishing (hereinafter also referred to as "CMP") have been used. CMP is a method used in polishing a thin insulating film (e.g., $SiO_2$ film) or a metal thin film used for wiring in the production of semiconductor devices, to smoothen a substrate or to remove an excess amount of a metal thin film during formation of wirings (see, for example, U.S. Pat. No. 4,944,836).

A polishing liquid for metals (hereinafter may also be referred to as "metal-polishing liquid") used in CMP generally includes abrasive grains (e.g., of alumina) and an oxidizing agent (e.g., hydrogen peroxide). The mechanism of CMP is considered to be as follows: the oxidizing agent oxidizes the surface of metal to form an oxide film, and the resultant oxide film is removed by the abrasive grains (see, for example, the *Journal of the Electrochemical Society*, 1991, Vol. 138, No. 11, pp. 3460 to 3464).

However, when chemical mechanical polishing (CMP) is conducted using a metal-polishing liquid containing such solid abrasive grains, scratches may be caused by polishing, or phenomena may occur such as excessive polishing (thinning) of the entire polished surface, excessive polishing of only a center portion of a polished metal surface resulting in dish-like subsidence of the surface (dishing) such that the polished metal surface is not planar, or dish-like subsidence (erosion) at plural metal wiring surfaces caused by excessive polishing of insulating material between the metal wirings. Furthermore, when a metal-polishing liquid containing solid abrasive grains is used in a cleaning process that is normally performed to remove any polishing liquid remaining on a polished semiconductor surface, the cleaning process is complicated and, furthermore, in order to dispose of the liquid after the washing (waste liquid), the solid abrasive grains need to be sedimented and separated, causing problems in terms of increased costs.

In order to address the problems in the conventional art, a method, for example, of polishing a metal surface using a combination of an abrasive-free polishing liquid and dry etching has been disclosed (see, for example, the *Journal of the Electrochemical Society*, 2000, Vol. 147, No. 10, pp. 3907 to 3913). As an abrasive grain-free metal-polishing liquid, a metal-polishing liquid including, for example, hydrogen peroxide, malic acid, benzotriazole, ammonium polyacrylate and water, and a method of polishing with the same have been disclosed (see, for example, Japanese Patent Application Laid-Open (JP-A) No. 2001-127019). According to the polishing methods described in these documents, projected portions of a metal film of a semiconductor substrate are selectively polished away by CMP while the metal film remains in concave portions to provide a desired conductor pattern, but there is the problem that a sufficient polishing rate is difficult to achieve because CMP in this case proceeds by means of friction with a significantly mechanically softer polishing pad than in the case of the conventional solid abrasive grain-containing liquid.

As wiring metals, hitherto, tungsten and aluminum have been generally used in the interconnect structure. However, in order to achieve higher performance, LSIs that use copper, which has lower wiring resistance than these metals, have been developed. As a process for wiring copper, for instance, a damascene process disclosed in JP-A No. 2-278822 is known. Furthermore, a dual damascene process in which a contact hole and a wiring groove are simultaneously formed in an interlayer insulating film and a metal is embedded in both of the hole and the groove is in wide use. As a target material for such copper wiring, a copper target having high purity of five ninths or more has been used. However, recently, as wirings are miniaturized to realize further densification, the conductivity and electric characteristics of the copper wiring require improvement; accordingly, a copper alloy in which a third component is added to high-purity copper is under study. Simultaneously, a high-performance metal-polishing means that can exert high productivity without contaminating the high-precision and high-purity material is in demand.

Furthermore, recently, in order to improve productivity, wafer diameter is enlarged when producing LSIs. At present, a diameter of 200 mm or more is generally used, and production at a magnitude of 300 mm or more has also been started. As wafer diameter is increased in this way, a difference in polishing speed tends to occur between a central portion and a peripheral portion of the wafer; accordingly, achievement of uniformity of polishing is becoming a pressing concern.

As a method of chemically polishing copper or a copper alloy without using a mechanical polishing procedure, a method of utilizing a chemical dissolution action is known (see, for example, JP-A No. 49-122432). However, methods of chemical polishing merely relying on chemical dissolution result in problems in planarity such as dishing (dish-like concave), even more so than CMP in which projected portions of the metal film are selectively polished both chemically and mechanically.

Furthermore, an aqueous dispersion for chemical mechanical polishing, which contains an organic compound that prevents the polishing pad from deteriorating, has been disclosed (see, for example, JP-A No. 2001-279231). However, even when the polishing aqueous dispersion is used, there remains a risk that the dishing phenomenon may occur whereby the metal of a wiring portion is excessively polished to cause a dish-like concavity.

For the purpose of planarizing a surface to be polished, a processing liquid containing a chelating agent selected from iminodiacetic acid and salts thereof, which is useful in modifying the surfaces of wafers (see, for example, Japanese National Phase Publication No. 2002-538284) and a CMP composition containing an α-amino acid (see, for example, Japanese National Phase Publication No. 2003-507894) have also been proposed.

Generally, a copper wiring is polished at high speed, and then tantalum or an alloy thereof often used as a barrier metal of a copper wiring, and copper, are polished precisely to planarize the region in the proximity of the wiring. Accordingly, realization of a polishing liquid that can selectively polish copper over tantalum (hereinafter referred to as Cu/Ta selectivity) is currently desired, whereby copper is easily polished away while tantalum is hardly polished away when the copper polishing is complete.

In conventional polishing methods, however, polishing for an excessively long time is carried out in a second polishing step so that a conductor film does not remain on a wafer. In the polished surface after the second polishing step, therefore, dishing occurs, that is, the phenomenon whereby the surface of the conductor film in a portion corresponding to a wiring groove subsides relative to the surface of a barrier metal film.

SUMMARY

According to an aspect of the invention, a metal-polishing liquid is provided that is capable of achieving rapid CMP speed and improving the planarity of a polished surface that exhibits less dishing. According to another aspect of the invention, a method of polishing using the metal-polishing liquid is provided.

That is, according to an aspect of the invention, a liquid for polishing a metal includes:

colloidal silica particles having an average primary particle size of from 10 nm to 25 nm and an average secondary particle size of from 50 nm to 70 nm;

a metal anticorrosive agent;

at least one compound selected from the group consisting of a surfactant and a water-soluble polymer compound;

an oxidizing agent; and an organic acid, wherein the polishing liquid is used for chemically and mechanically polishing a conductor film including copper or a copper alloy during production of a semiconductor device.

According to an another aspect of the invention, a method of chemically and mechanically polishing a conductor film including copper or a copper alloy in production of a semiconductor device is provided, the method including using a liquid for polishing a metal which includes:

colloidal silica particles having an average primary particle size of from 10 nm to 25 nm and an average secondary particle size of from 50 nm to 70 nm;

a metal anticorrosive agent;

at least one compound selected from the group consisting of a surfactant and a water-soluble polymer compound;

an oxidizing agent; and an organic acid.

DETAILED DESCRIPTION OF THE INVENTION

In the invention, colloidal silica is employed as an abrasive grain and used in combination with a metal anticorrosive agent, a surfactant or a water-soluble polymer compound, an oxidizing agent and an organic acid, thereby providing a metal-polishing liquid with which a high polishing rate is achieved that results in little dishing. This achievement is thought to be attributable to improved properties of the polishing liquid, whereby the polishing rate can be controlled and dishing can be suppressed, which are attained by controlling the primary particle size of colloidal silica and the secondary particle size of aggregated colloidal silica respectively to within a predetermined range.

According to exemplary embodiments of the invention, there are provided a metal-polishing liquid capable of achieving rapid CMP speed and improving the planarity of a polished surface that exhibits less dishing, and a method of polishing using the metal-polishing liquid.

Hereinafter, exemplary embodiments of the invention are described in detail.

Metal-Polishing Liquid

The metal-polishing liquid of according to an aspect of the invention is used mainly in chemical mechanical polishing (CMP) of a conductor film consisting of copper or a copper alloy. The metal-polishing liquid includes (a) colloidal silica particles having an average primary particle size of 10 nm to 25 nm and an average secondary particle size of 50 nm to 70 nm (hereinafter referred to sometimes as "specific colloidal silica"), (b) a metal anticorrosive agent, (c) a surfactant or a water-soluble polymer compound, (d) an oxidizing agent, and (e) an organic acid.

Hereinafter, the components included in the metal-polishing liquid are described respectively.

(a) Specific Colloidal Silica

The average primary particle size of the specific colloidal silica used in the invention is determined by ascertaining the overall shape of the particles using a photograph taken with a scanning electron microscope S4800 (trade name, manufactured by Hitachi High-Technologies Corp.), then observing the particles from a direction from which the primary particle size thereof can be confirmed, measuring the particle sizes of 100 or more arbitrarily selected particles, and calculating the average size thereof.

The average primary particle size of the specific colloidal silica (a) is in the range of from 10 nm to 25 nm, preferably in the range of from 15 nm to 25 nm, and more preferably in the range of from 20 nm to 25 nm.

When the average primary particle size of the colloidal silica is less than 10 nm, the polishing rate of a conductor film is low. When the average primary particle size is more than 30 nm, dishing becomes serious.

The average secondary particle size of the specific colloidal silica (a) is from 50 nm to 70 nm, preferably from 55 nm to 65 nm, and more preferably from 60 nm to 65 nm.

The average secondary particle size of the specific colloidal silica (a) is measured, for example, by dynamic light scattering method. In the dynamic light scattering method, the average particle size (average secondary particle size) of the specific colloidal silica which is dispersed in pure water is measured using a measurement apparatus such as LB-500 (trade name, manufactured by HORIBA Ltd.) or the like.

When the specific colloidal silica has the average primary particle size in the above range and also has the average secondary particle size in the above range, dishing is suitably suppressed.

As the specific colloidal silica (a), a commercially-available product may also be used. For example, colloidal silica available from Fuso Chemical Co., Ltd. under the trade name PL-1H (primary particle size: 15 nm, secondary particle size: 55 nm), PL-2 (primary particle size: 25 nm, secondary particle size: 50 nm) or PL-2H (primary particle size: 25 nm, secondary particle size: 60 nm) has the particle sizes of the specific silica particles (a) defined in the invention and can be used in the invention.

The specific colloidal silica satisfying both the primary and secondary particle sizes may be selected from commercially-available products having particles sizes in the above ranges or may be prepared by conventional methods.

The amount of the specific colloidal silica may be from 0.005 to 5 wt %, and preferably from 0.008 to 2 wt %, with respect to the metal-polishing liquid used in polishing.

(b) Metal Anticorrosive Agent

The metal anticorrosive agent protects a conductor film from corrosion caused by hydrogen peroxide, thereby preventing corrosion of the surface of the conductor film and defects and erosion of the conductor film due to the corrosion. Also, the metal anticorrosive agent protects the surface of a conductor film, thereby preventing excessive polishing of the conductor film and preventing the conductor film from dishing.

Examples of the metal anticorrosive agent that can be used in the invention include benzotriazoles (benzotriazole and derivatives thereof) represented by Formula (I):

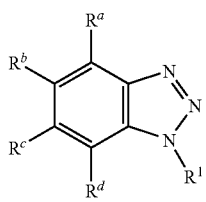

wherein, in Formula (I), $R^1$ represents a hydrogen atom or an alkyl group having 1 to 10 carbon atoms; and $R^a$, $R^b$, $R^c$ and $R^d$ independently represent a hydrogen atom or a monovalent substituent.

When $R^1$ in Formula (I) represents an alkyl group, the alkyl group may further have a substituent. Examples of the substituent that can be introduced into the alkyl group include a carboxyl group, a hydroxyl group, an alkyl group, an amino group, a sulfo group and an alkoxyl group. The substituent is preferably a carboxyl group, a hydroxyl group or an amino group, and more preferably an amino group. The amino group preferably has a substituted or unsubstituted alkyl group. Examples of the substituent which may be possessed by the alkyl group as a substituent on the amino group include a carboxyl group, a hydroxyl group, an amino group, a sulfo group and an alkoxyl group. The substituent is preferably a carboxyl group, a hydroxyl group or an amino group, and more preferably a hydroxyl group. It is also preferable that $R^1$ is a hydrogen atom.

Examples of the monovalent substituent represented by $R^a$, $R^b$, $R^c$ or $R^d$ is not particularly limited. Preferable examples of the monovalent substituent include an alkyl group having 1 to 8 carbon atoms, an amino group, a carboxyl group, a sulfo group, a carbamoyl group and an amido group, more preferably an alkyl group having 1 to 5 carbon atoms, and still more preferably a methyl group.

It is also preferable that $R^a$, $R^b$, $R^c$ and $R^d$ independently represent a hydrogen atom.

Specific examples of the compound represented by Formula (I) (Exemplary Compounds (I-1) to (I-15)) are shown below, but the invention is not limited thereto.

I-1

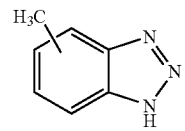

I-2

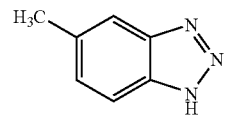

I-3

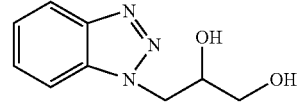

I-4

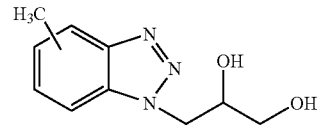

I-5

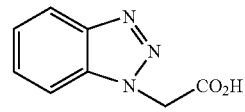

I-6

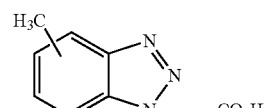

I-7

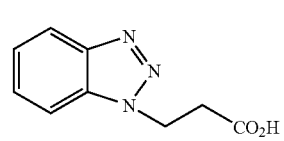

I-8

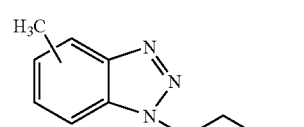

I-9

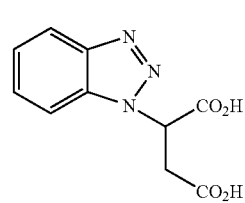

I-10

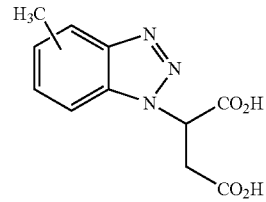

I-11

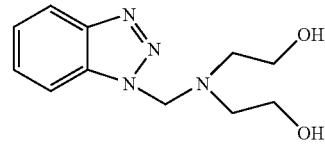

I-12

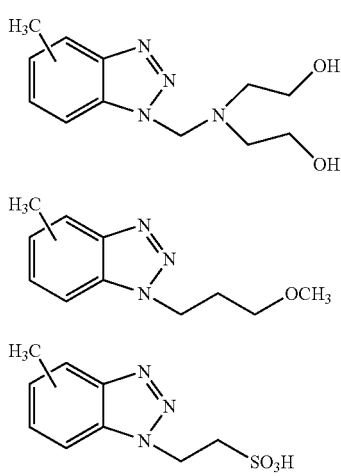

From the viewpoint of attaining particularly excellent polishing rate and planarity, the benzotriazole derivative is preferably 1-(1,2-dicarboxyethyl)benzotriazole, 1-(2,3-dihydroxypropyl)benzotriazole, 1-[N,N-bis(hydroxydiethyl)aminomethyl]-benzotriazole, or 1-(hydroxymethyl)benzotriazole.

Examples of the metal anticorrosive agent used in the invention include not only the benzotriazole derivatives represented by Formula (I), but also for example, nitrogen-containing heterocyclic compounds which can protect a conductor film from corrosion due to hydrogen peroxide.

The heterocyclic compound suitable as the metal anticorrosive agent in the invention is preferably a 5-memberred heterocyclic compound, and more preferably azoles. Examples of the azoles include imidazoles, triazoles, tetrazoles and thiazoles, among which imidazoles, triazoles and tetrazoles are preferable. The "tetrazole" as used herein encompasses tetrazoles other than the tetrazole represented by Formula (I).

Specific examples of the imidazoles include imidazole, benzimidazole, 1-vinylimidazole, 1-phenylimidazole, 1-butylimidazole, 1-benzylimidazole, 1-methylimidazole, 2-methylimidazole, 2-phenylimidazole, 2-heptadecylimidazole, 2-mercaptobenzimidazole, 2-aminobenzimidazole, 2-amino-4,5-dicyanoimidazole, 4-phenylimidazole, 4-imidazolecarboxylic acid, 5-nitrobenzimidazole, and N-(n-butyl)imidazole.

Specific examples of the triazoles include 1,2,3-triazole, 1,2,4-triazole, tollyltriazole, benzotriazole, 1,2,3-triazole-4,5-dicarboxylic acid, 1-methylbenzotriazole, 1-hydroxybenzotriazole, 3-amino-1,2,4-triazole, 3-nitro-1,2,4-triazole, and 5-nitrobenzotriazole.

Specific examples of the tetrazoles include 5-aminotetrazole, 5-methyltetrazole, tetrazole-pentaacetic acid, and tetrazole-monoacetic acid.

A compound represented by the following Formula (II) may be used in combination with the metal anticorrosive agent in the invention.

$$X^1\text{-L-}X^2 \quad (II)$$

wherein, in Formula (II), $X^1$ and $X^2$ independently represent a heterocycle containing at least one nitrogen atom, and L represents a divalent linking group.

Examples of the nitrogen-containing heterocycle represented by $X^1$ or $X^2$ in Formula (II) include a pyrrole ring, a pyran ring, an imidazole ring, a pyrazole ring, a thiazole ring, an isothiazole ring, an oxazole ring, an isooxazole ring, a pyridine ring, a pyrazine ring, a pyrimidine ring, a pyridazine ring, a pyrrolidine ring, a pyrazolidine ring, an imidazolidine ring, an isoxazolidine ring, an isothiazolidine ring, a piperidine ring, a piperazine ring, a morpholine ring, a thiomorpholine ring, an indoline ring, an isoindoline ring, a pyrinezine ring, an indolizine ring, an indole ring, an indazole ring, a purine ring, a quinolizine ring, an isoquinoline ring, a quinoline ring, a naphthyridine ring, a phthalazine ring, a quinoxaline ring, a quinazoline ring, a cinnoline ring, a pteridine ring, an acridine ring, a perimidine ring, a phenanthroline ring, a carbazole ring, a carboline ring, a phenazine ring, an anthyridine ring, a thiadiazole ring, an oxadiazole ring, a triazine ring, a 1,2,3-triazole ring, a 1,2,4-triazole ring, a tetrazole ring, a benzimidazole ring, a banzoxazole ring, a benzothiazole ring, a benzothiadiazole ring, a benzofuroxan ring, a naphthoimidazole ring, a benzotriazole ring and a tetraazaindene ring, among which a tetrazole ring, a 1,2,4-triazole ring, a 1,2,3-triazole ring and a benzotriazole ring are preferable, and a tetraazole ring and a 1,2,3-triazole ring are more preferable.

$X^1$ and $X^2$ may be the same as or different from each other.

The divalent linking group represented by L in Formula (II) may be a linking group having 1 to 15 carbon atoms. Examples of this linking group include an alkylene group (for example, a methylene group, an ethylene group, a trimethylene group, a tetramethylene group, a hexamethylene group, a 1,4-cyclohexylene group, or a 1,1,3-trimethylhexylene group), an arylene group (for example, a p-phenylene group, an m-phenylene group, or a naphthalene group), a heterocyclic group (for example, a pyridine ring-linking group, a triazine ring-linking group, a triazole ring-linking group, or a thiadiazole ring-linking group), a ureido group, an amide group, an ester group, a carbonate group, a carbamate group, a sulfonamide group, a thioureido group, an ether group, a thioether group and an amino group. The linking group may be a divalent linking group constituted by combination of two or more of the above linking groups.

Specific examples of the divalent linking group represented by L include the following linking groups.

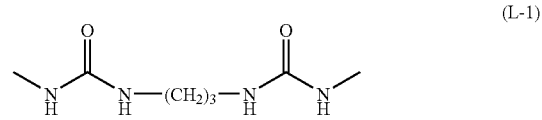

(L-1)

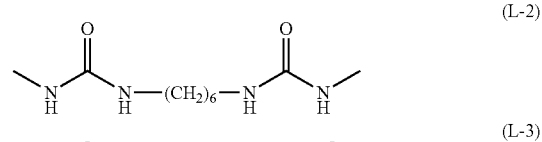

(L-2)

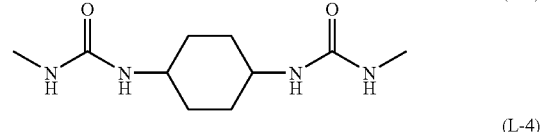

(L-3)

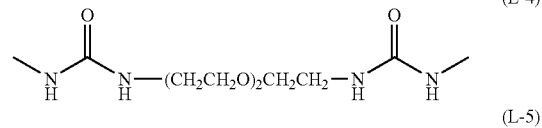

(L-4)

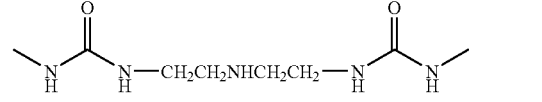

(L-5)

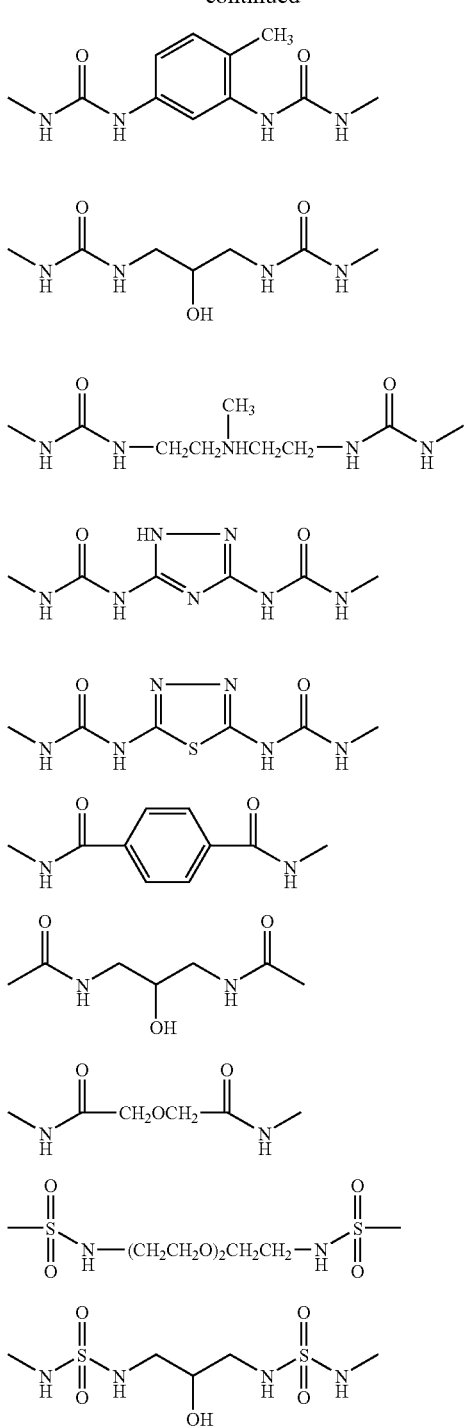

The linking group L in Formula (II) may further have a substituent as long as the effect of the invention is not impaired. Examples of the substituent that can be introduced into L include a halogen atom (such as a fluorine atom, a chlorine atom, a bromine atom or an iodine atom), an alkyl group (such as a linear, branched or cyclic alkyl group, which may be a polycyclic alkyl group such as a bicyclo-alkyl group or may include an active methine group), an alkenyl group, an alkynyl group, an aryl group, a heterocyclic group (its substituted site is not restricted), an acyl group, an alkoxycarbonyl group, an aryloxycarbonyl group, a heterocyclic oxycarbonyl group, a carbamoyl group (including a carbamoyl group having a substituent, such as an N-hydroxycarbamoyl group, an N-acylcarbamoyl group, an N-sulfonylcarbamoyl group, an N-carbamoylcarbamoyl group, a thiocarbamoyl group or an N-sulfamoylcarbamoyl group), a carbazoyl group, a carboxyl group or salts thereof, an oxalyl group, an oxamoyl group, a cyano group, a carbonimidoyl group, a formyl group, a hydroxy group, an alkoxy group (including groups having repeated ethyleneoxy or propyleneoxy groups), an aryloxy group, a heterocyclic oxy group, an acyloxy group, an alkoxycarbonyloxy group, an aryloxycarbonyloxy group, a carbamoyloxy group, a sulfonyloxy group, an amino group, an alkyl amino group, an aryl amino group, a heterocyclic amino group, an acylamino group, a sulfonamide group, a ureido group, a thioureido group, an N-hydroxyureido group, an imido group, an alkoxycarbonylamino group, an aryloxycarbonylamino group, a sulfamoylamino group, a semicarbazide group, a thiosemicarbazide group, a hydrazino group, an ammonio group, an oxamoylamino group, an N-alkylsulfonylureido group, an N-arylsulfonylureido group, an N-acylureido group, an N-acylsulfamoylamino group, a hydroxyamino group, a nitro group, a heterocyclic ring group containing a quaternarized nitrogen atom (for example, a pyridinio group, an imidazolio group, a quinolinio group or an isoquinolinio group), an isocyano group, an imino group, a mercapto group, an alkylthio group, an arylthio group, a heterocyclic thio group, an alkyldithio group, an aryldithio group, a heterocyclic dithio group, an alkylsulfonyl group, an arylsulfonyl group, an alkylsulfinyl group, an arylsulfinyl group, a sulfo group, a sulfamoyl group (including a sulfamoyl group having a substituent, such as an N-acylsulfamoyl group or an N-sulfonylsulfamoyl group), a phosphino group, a phosphinyl group, a phosphinyloxy group, a phosphinylamino group, and a silyl group.

The divalent linking group represented by L is particularly preferably a linking group containing a ureido group, an amide group, an ester group, a carbonate group, a carbamate group, a sulfonamide group, an -ether group, a thioether group or a heterocyclic group, or a divalent linking group substituted by a hydroxyl group, a carboxyl group, a sulfo group, or the like. The divalent linking group is more preferably a linking group containing a ureido group, an amide group, an ether group or an amino group, or a linking group substituted by a hydroxyl group.

When the compound having such linking group is used in combination with the metal anticorrosive agent in the invention, the resultant metal-polishing liquid has improved polishing rate and planarity.

Specific examples of the compounds represented by Formula (II) in the invention (Exemplary Compounds (II-1) to (II-20)) are shown below, but the invention is not limited thereto.

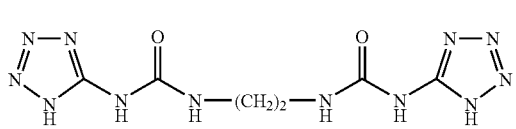

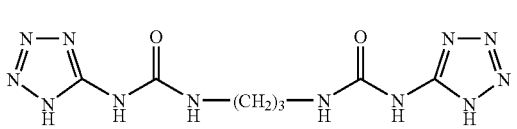

-continued
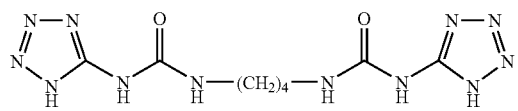
(II-3)
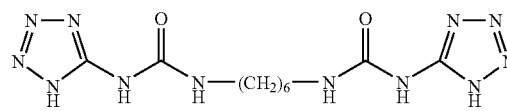
(II-4)
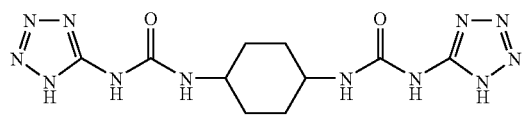
(II-5)
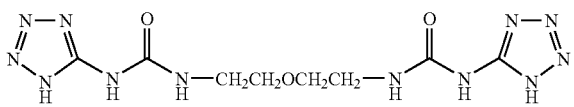
(II-6)
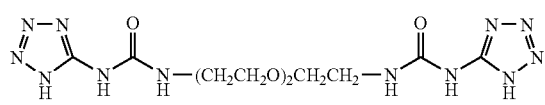
(II-7)
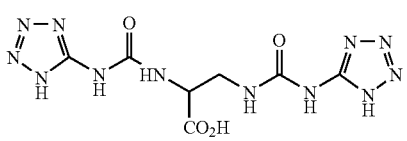
(II-8)
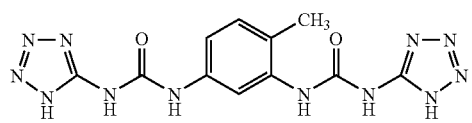
(II-9)
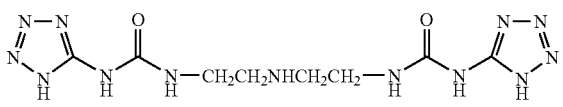
(II-10)
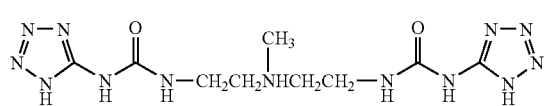
(II-11)
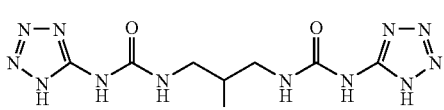
(II-12)
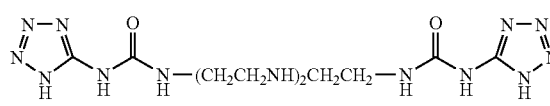
(II-13)
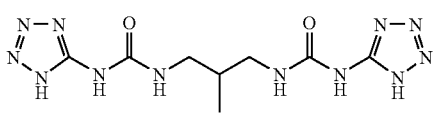
(II-14)
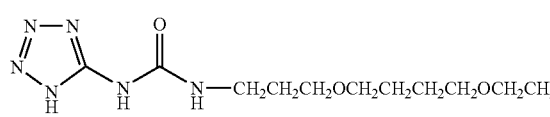
(II-15)
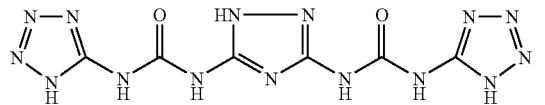
(II-16)
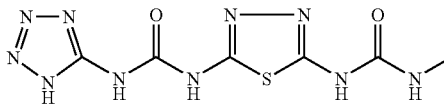
(II-17)
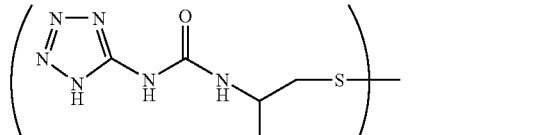
(II-18)
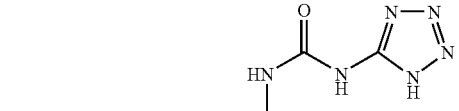
(II-19)
(II-20)
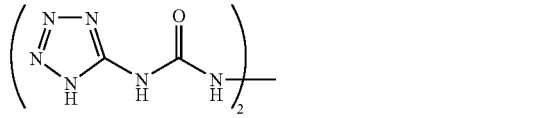

It is particularly preferable that the heterocycles represented by $X^1$ and $X^2$ in Formula (II) independently represent tetrazole, 1,2,4-triazole, 1,2,3-triazole or benzotriazole from the viewpoints of improved polishing rate and planarity.

The metal anticorrosive agents used in the invention may be used alone or in combination of two or more thereof. These compounds can be synthesized by conventional methods or may be available as the commercial products described above.

The total amount of the metal anticorrosive agents to be added in the invention, in whichever aspect, is preferably in the range of from 0.000001 mol to 1.0 mol, more preferably in the range of from 0.000005 mol to 0.5 mol, and still more preferably in the range of from 0.00001 mol to 0.05 mol, per one liter of the metal-polishing liquid used in polishing (which is a diluted product obtained by diluting an undiluted metal-polishing liquid with water or an aqueous solution).

(c) Surfactant or Water-soluble Polymer Compound

Examples of the surfactant include anionic surfactants. Examples of the anionic surfactants preferably include carboxylate surfactants, sulfonate surfactants, phosphate surfactants, sulfate surfactants and mixtures thereof, and particularly preferably carboxylate surfactants and sulfate surfactants. A substituent thereon is particularly preferably a polyoxyethylene group.

The carboxylate surfactants are preferably those having a —$CONR^4$— group in which $R^4$ represents H or a methyl group. Examples of the carboxylate surfactants include N-acylamino acid salts (for example, coconut oil fatty acid sarcosine triethanolamine, lauroyl sarcosine potassium, oleyl sarcosine, and lauroyl methyl alanine sodium).

The sulfonate surfactants are preferably those having at least one group selected from the group consisting of a phenyl group, a —$CONR^5$— group (in which $R^5$ represents H or an alkyl group having 1 to 3 carbon atoms), and a —COO— group. Examples of the sulfonate surfactants include dodecylbenzenesulfonic acid, coconut oil fatty acid methyl taurine sodium, and dialkylsulfosuccinic acid and monoalkylsulfosuccinic acid (for example, sodium dioctylsulfosuccinate, disodium sulfosuccinate to which 4 molecules of alkyl ether-polyoxyethylene having 12 to 14 carbon atoms were added, etc.).

The phosphate surfactants are preferably those having a polyoxyethylene group or a phenyl group. Examples of the phosphate surfactants include polyoxyethylene alkylphenyl ether phosphate and polyoxyethylene alkyl ether phosphate, such as lauryl ether sodium phosphate (to which 10 molecules of di-(polyoxyethylene were added) or di(alkyl ether phosphoric acid having 12 to 15 carbon atoms to which 2 molecules of polyoxyethylene were added).

The sulfate surfactants are preferably those having a polyoxyethylene group or a —$CONR^6$— group (in which $R^6$ represents H or a methyl group). Examples of the sulfate surfactants include polyoxyethylene coconut oil fatty acid monoethanol amide sodium sulfate and polyoxyethylene alkyl ether sulfate (for example, polyoxyethylene lauryl ether sodium sulfate or polyoxyethylene lauryl ether sulfuric acid triethanolamine).

These anionic surfactants may have formed alkali metal salts (for example, sodium salts and potassium salts), ammonium salts, or amine salts (for example, triethanolamine salt). The alkali metal salts are preferably amine salts, and particularly preferably triethanolamine salt.

A surfactant having a triple bond in a molecule thereof is preferably used in combination with the anionic surfactant. Preferably, this surfactant is represented by $R^2$—C≡C—$R^3$ (in which $R^2$ and $R^3$ each represent an alkyl group having a substituent). An example of the surfactant is diisobutyl dimethyl butynediol polyoxyethylene glycol ether.

The amount of the surfactant is preferably from 0.005 to 0.5 wt %, and more preferably from 0.05 to 0.3 wt %, with respect to the metal-polishing liquid used in polishing. When the amount is less than 0.005 wt %, dishing cannot be sufficiently suppressed. When the amount is more than 0.5 wt %, the polishing rate of a conductor film is decreased.

The water-soluble polymer compound is desirably a polysaccharide, or polyvinyl alcohol having a weight-average molecular weight of 20,000 to 400,000. In this case, the polysaccharide is desirably at least one member selected from storage polysaccharides such as starch, amylopectin or glycogen, structural polysaccharides such as cellulose, pectin or hemicellulose, and extracellular polysaccharides such as pullulan or erucinan. Among them, pullulan is particularly desirable from the viewpoint of sufficiently reducing the polishing rate. From the viewpoint of sufficiently preventing a reduction in the polishing rate, the amount of the water-soluble polymer compound is preferably 0.0005 wt % or more, and more preferably 0.01 wt % or more, with respect to the metal-polishing liquid used in polishing.

The surfactants or the water-soluble compounds may be used alone or in combination thereof.

(d) Oxidizing Agent

The metal-polishing liquid of the invention further includes an oxidizing agent that oxidizes a metal to be polished.

Examples of the oxidizing agent include hydrogen peroxide, a peroxide, a nitrate, an iodate, a periodate, a hypochlorite, a chlorite, a chlorate, a perchlorate, a persulfate, a dichromate, a permanganate, ozone water, a silver (II) salt, and an iron (III) salt.

Preferred examples of the iron (III) salt include inorganic iron (III) salts such as iron (III) nitrate, iron (III) chloride, iron (III) sulfate, and iron (III) bromide, and organic complex salts of iron (III).

When an organic complex salt of iron (III) is used, examples of a complex-forming compound that forms an iron (III) complex salt with the organic complex salt include acetic acid, citric acid, oxalic acid, salicylic acid, diethyldithiocarbamic acid, succinic acid, tartaric acid, glycolic acid, glycine, alanine, aspartic acid, thioglycolic acid, ethylene diamine, trimethylene diamine, diethylene glycol, triethylene glycol, 1,2-ethanedithiol, malonic acid, glutaric acid, 3-hydroxybutyric acid, propionic acid, phthalic acid, isophthalic acid, 3-hydroxysalicylic acid, 3,5-dihydroxysalicylic acid, gallic acid, benzoic acid, maleic acid, salts thereof, and an aminopolycarboxylic acid and a salt thereof.

Examples of the aminopolycarboxylic acid and the salts thereof include ethylenediamine-N,N,N',N'-tetraacetic acid, diethylenetriaminepentaacetic acid, 1,3-diaminopropane-N,N,N',N'-tetraacetic acid, 1,2-diaminopropane-N,N,N',N'-tetraacetic acid, ethylenediamine-N,N'-disuccinic acid (racemic body), ethylenediaminedisuccinic acid (SS isomer), N-(2-carboxylatoethyl)-L-aspartic acid, N-(carboxymethyl)-L-aspartic acid, β-alaninediacetic acid, methyliminodiacetic acid, nitrilotriacetic acid, cyclohexanediaminetetraacetic acid, iminodiacetic acid, glycol ether diamine-tetraacetic acid, ethylenediamine-1-N,N'-diacetic acid, ethylenediamine-ortho-hydroxyphenylacetic acid, N,N-bis(2-hydroxybenzyl)ethylenediamine-N,N-diacetic acid, and the salts thereof. The counter salt is preferably an alkali-metal salt or an ammonium salt, and particularly preferably an ammonium salt.

In particular, hydrogen peroxide, an iodate, a hypochlorite, a chlorate, a persulfate, and an organic iron (III) complex salt are preferable. When an organic iron (III) organic complex salt is used, example of a preferable complex-forming compound include citric acid, tartaric acid, aminopolycarboxylic acid (specifically, ethylenediamine-N,N,N',N'-tetraacetic acid, diethylenetriaminepentaacetic acid, 1,3-diaminopropane-N,N,N',N'-tetraacetic acid, ethylenediamine-N,N'-disuccinic acid (racemic body), ethylenediamine disuccinic acid (SS isomer), N-(2-carboxylatoethyl)-L-aspartic acid, N-(carboxymethyl)-L-aspartic acid, β-alanine diacetic acid, methyliminodiacetic acid, nitrilotriacetic acid, and iminodiacetic acid).

Among the oxidizing agents, hydrogen peroxide, a persulfate and ethylenediamine-N,N,N',N'-tetraacetic acid, 1,3-diaminopropane-N,N,N',N'-tetraacetic acid, and ethylenediaminedisuccinic acid (SS form) complexes of iron (III) are most preferable.

The amount of the oxidizing agent (d) to be added is preferably from 0.003 mol to 8 mol, more preferably from 0.03 mol to 6 mol, and particularly more preferably from 0.1 mol to 4 mol, per 1 L of the metal-polishing liquid used in polishing. The amount of the oxidizing agent is preferably 0.003 mol or more for assuring a CMP rate oxidizing the metal sufficiently and is 8 mol or less for prevention of roughening of the polishing face.

The oxidizing agent is preferably used by mixing to a composition including other components than the oxidant when a polishing liquid is used to polish. A timing when the oxidizing agent is mixed is preferably within 1 hr immediately before the polishing liquid is used, more preferably within 5 min, and particularly preferably within 5 sec immediately before feeding, after disposing a mixer immediate before the polishing liquid is fed in a polishing machine, on a surface to be polished.

(e) Organic Acid

In an exemplary embodiment of the invention, the metal-polishing liquid preferably further includes at least one organic acid. The organic acid as used herein is not an oxidant of the metal, but has function of accelerating oxidation, of adjusting the pH and as a buffer agent.

Examples of the organic acid include organic acids and amino acids.

The organic acid is desirably a water-soluble organic acid, and more preferable examples thereof include the following organic acids:

formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, hydroxyethyliminodiacetic acid, iminodiacetic acid, acetamidoiminodiacetic acid, nitrilotripropanoic acid, nitrilotrimethylphoshonic acid, dihydroxyethyl glycine, tricine, ammonium salts or alkali metal salts of these acids, ammonium salts of these acids, or mixtures of these acids.

As the amino acid, a water-soluble amino acid is preferable, and preferable examples include the following amino acids:

glycine, L-alanine, β-alanine, L-2-aminobutyric acid, L-norvaline, L-valine, L-leucine, L-norleucine, L-isoleucine, L-alloisoleucine, L-phenylalanine, L-proline, sarcosine, L-ornithine, L-lysine, taurine, L-serine, L-threonine, L-allothreonine, L-homoserine, L-tyrosine, 3,5-diiodo-L-thyrosine, β-(3,4-dihydroxyphenyl)-L-alanine, L-thyroxin, 4-hydroxy-L-proline, L-cysteine, L-methionine, L-ethionine, L-lanthionine, L-cystathionine, L-cystine, L-cystic acid, L-aspartic acid, L-glutamic acid, S-(carboxymethyl)-L-cysteine, 4-aminobutyric acid, L-asparagine, L-glutamine, azaserine, L-arginine, L-canavanine, L-citrulline, δ-hydroxyl-L-lysine, creatine, L-kynurenine, L-histidine, 1-methyl-L-histidine, 3-methyl-L-histidine, ergothioneine, L-tryptophan, actinomycin C1, apamin, angiotensin I, angiotensin II and antipain.

Among the organic acids and the amino acids, the following aminocarboxylic acids are particularly preferably used in the invention.

That is, the aminocarboxylic acids are glycine, iminodiacetic acid, methyliminodiacetic acid, n-methylglycine, nitrilotripropanoic acid, hydroxyethyliminodiacetic acid, β-alanine, glycylglycine, dihydroxyethylglycine, acetamidoiminodiacetic acid, and tricine.

In the metal-polishing liquid of invention, the organic acids may be used alone or in combination of two or more thereof.

These organic acids can be synthesized by conventional methods or may be available as commercial products.

The amount of the organic acid to be added is preferably from 0.005 to 0.5 mol, more preferably from 0.01 to 0.3 mol, and still more preferably from 0.05 to 0.3 mol, per 1 L of the metal-polishing liquid when used in polishing. The amount of the organic acid to be added is preferably 0.005 mol or more from the viewpoint of improving the polishing rate, and the amount is preferably 0.5 mol or less from the viewpoint of preventing dishing from being serious.

pH

In the invention, the pH is adjusted appropriately depending on adsorption and reactivity on a surface to be polished, the solubility of a metal to be polished, the electrochemical properties of a surface to be polished, the dissociated state of functional groups in a compound, the stability thereof as a liquid, and the like.

The pH of the metal-polishing liquid in the invention is preferably in the range of from 3 to 10, preferably from 4 to 9, and more preferably from 6 to 8. When the metal-polishing liquid has a pH in the above range, the metal-polishing liquid exhibits a particularly excellent effect. The polishing liquid of the invention may be in a water-free form. In this case, the pH represents a value of the pH of the metal-polishing liquid of the invention after being dissolved in water in a state used in polishing.

Polishing Method

The polishing method according to an exemplary embodiment of the invention includes chemically and mechanically polishing a substrate having a conductor film consisting of copper or a copper alloy using the metal-polishing liquid of the invention in a process for manufacturing a semiconductor device.

The metal-polishing liquid used in the polishing method according to the invention may be a concentrated solution that is diluted with water before use, a combination of the following aqueous solutions of respective components that are mixed and diluted as needed with water before use, or a solution prepared for immediate use. The metal-polishing liquid of the invention, without particular limitation, may be used in any of these modes.

According to the polishing method of the invention, a preferable exemplary embodiment is to polish a substrate surface with a polishing pad which is attached to a polishing platen by moving the polishing pad and the substrate surface to be polished relative to each other in a state in which the substrate surface to be polished is pressed by the polishing pad at a pressure of 20 kPa or less while the metal-polishing liquid is supplied.

As a polishing apparatus, a general polishing apparatus, which has a holder for holding a semiconductor substrate or the like having a surface to be polished and a polishing platen to which a polishing pad is applied (a motor having a variable rotation number is attached or the like), can be used.

The polishing pad may be a general nonwoven fabric, foamed polyurethane, porous fluorine resin or the like, and is not particularly limited. The polishing pad may also be a pad formed from a non-foamed body or a pad formed from a foamed body. The pad formed from a non-foamed body may be a rigid synthetic resin bulk material such as a plastic plate. The pad formed from a foamed body may be classified into three: closed cell foam (dry foam system); open cell foam (wet foam system); and a dual layer composite including the closed cell foam and the open cell foam (laminate system). Among them, the dual layer composite body (laminate system) is preferred. Foaming may be uniform or non-uniform.

The polishing pad may further include abrasive grains used in polishing.

The polishing pad may be made of a soft material or a hard material. In a pad of the laminate system, respective layers preferably have different hardnesses. Examples of the material of the pad include nonwoven fabric, artificial leather, polyamide, polyurethane, polyester and polycarbonate. Lattice grooves, pits, concentric grooves, spiral grooves or the like may be formed on the surface of the pad to be in contact with a surface to be polished.

The polishing conditions are not limited, but the linear velocity of a polishing platen is desirably 1 m/s or higher.

The pressure (polishing pressure) between the polishing pad and a semiconductor substrate having a surface to be polished (film to be polished) when the semiconductor substrate is pressed against the polishing pad is preferably 20 kPa or less, and more preferably 13 kPa or less. Such a low pressure is preferable since, while a high polishing rate is maintained, the uniformity of the polishing rate in a wafer in-plane and the planarity of patterns are improved. When the polishing pressure is higher than 20 kPa, planarity may deteriorate. The lower limit of the polishing pressure, although not particularly limited, is about 2 kPa.

During polishing, the metal-polishing liquid is continuously supplied to the polishing pad with a pump or the like. The supply amount of the metal-polishing liquid is not limited, but it is preferable that the surface of the polishing pad is always covered with the polishing liquid. A semiconductor substrate after completion of polishing is washed well in running water, and is dried after water droplets adhered to a semiconductor substrate have been removed using a spin dryer or the like.

In the polishing method of the invention, an aqueous solution used for diluting the metal-polishing liquid may be the following aqueous solution: an aqueous solution of water containing at least one selected from the group consisting of an oxidizing agent, an acid, an additive, and a surfactant. The components included in the aqueous solution and the components of the metal-polishing liquid to be diluted, as a whole, will serve as the components for polishing with the metal-polishing liquid. When the metal-polishing liquid is used after being diluted with an aqueous solution, a hardly-soluble component can be distributed in the form of an aqueous solution, whereby a more concentrated metal-polishing liquid can be prepared.

As an example of a method of diluting a concentrated metal-polishing liquid by adding water or an aqueous solution thereto, a method exists in which a pipe that supplies the concentrated metal-polishing liquid and a pipe that supplies water or an aqueous solution converge at a given point to mix the concentrated metal-polishing liquid with the water or the aqueous solution, and the mixed and diluted metal-polishing liquid is then supplied to a polishing pad. Mixing of the concentrated solution with water or an aqueous solution can be carried out, for example, by a method of colliding and mixing liquids together by passing them through a narrow channel in a pressurized state, a method of mixing by repetitively separating and converging streams of liquids through the use of elements such as glass tubes or the like provided in a pipe, or a method of disposing a power-rotated vane in the pipe.

The amount of the polishing liquid to be supplied to an object of polishing during the polishing of a conductor film is preferably in the range of from 0.070 to 0.30 ml/(min·cm$^2$), and more preferably in the range of from 0.1 to 0.25 ml/(min·cm$^2$) from the viewpoint of achieving a sufficient polishing rate.

Moreover, as another example of the method of polishing while continuing to dilute the concentrated solution with water or an aqueous solution, there is a method in which the pipe for supplying the polishing liquid and the pipe for supplying water or the aqueous solution are separately provided, and predetermined amounts of the liquid and the water or aqueous solution is supplied onto the polishing pad from respective pipes, and polishing is carried out while mixing the liquid and the water or aqueous solution by means of the relative motion between the polishing pad and the surface to be polished. Furthermore, a polishing method may also be employed in which predetermined amounts of the concentrated liquid and the water or aqueous solution are mixed in a single container, and then the mixture is supplied onto the polishing pad.

In another polishing method using the metal-polishing liquid of the invention, components which must be included in the metal-polishing liquid are divided into at least two constituent parts, and the constituent parts are diluted with water or an aqueous solution immediately before use and supplied onto the polishing pad on the polishing platen. Then, the polishing pad is allowed to contact the surface to be polished, to polish the surface by relative movement between them.

For example, a set or kit of a metal-polishing liquid is prepared which includes an oxidizing agent prepared as a constituent (A), and an acid, an additive, a surfactant and water prepared as a whole as a constituent (B), and the constituents (A) and (B) are used after dilution with water or an aqueous solution.

Alternatively, additives having low solubility are further divided into constituents (C) and (D), in which the constituent (C) includes an oxidizing agent, an additive and a surfactant while the constituent (D) includes an acid, an additive, a surfactant and water. The constituent (C) and the constituent (D) are diluted by adding water or an aqueous solution immediately before use.

In this case, three pipes that respectively supply the constituent (C), the constituent (D) and water or the aqueous solution are required. Mixing and dilution may be performed in such a manner that the three pipes are joined into one pipe that supplies the diluted polishing liquid to a polishing pad, and the constituents (C) and (D) and water or the aqueous solution are mixed in the joined pipe. It is also possible to converge two pipes in advance, and then join the remaining pipe to the converged pipe.

In this method, for example, after ensuring a long dissolution time by elongating the mixing passageway for mixing a constituent containing an additive having low solubility with other constituents, the pipe is joined to another pipe that supplies water or an aqueous solution.

In other mixing methods, three pipes are directly guided to the polishing pad to mix the liquids from the respective pipes on the surface of the pad by relative movement of the polishing pad and the surface to be polished as described above, or three constituents are mixed in a vessel to supply the diluted metal-polishing liquid therefrom to the polishing pad. In any of the above-mentioned polishing methods, one constituent containing an oxidizing agent is maintained at 40° C. or less while the other constituents are heated to a temperature in the range of from ambient temperature to 100° C., and the mixed liquid may be adjusted to 40° C. or less when the one constituent and the other constituents are used by diluting with water or an aqueous solution. Since higher temperature increases solubility, this method is preferable for increasing the solubility of materials having low solubility in the metal-polishing liquid.

The raw materials of other constituents that do not contain the oxidizing agent and that are dissolved by heating at a temperature in the range of from ambient temperature to 100° C. may be precipitated in solution when the temperature decreases. Therefore, when constituents of which the temperature has decreased are used, the precipitated constituents should be dissolved by heating. For this purpose, a means for feeding a liquid containing a constituent that has been dissolved therein by heating, or a means for stirring a liquid containing precipitates, feeding the liquid through a pipe, and heating the pipe to dissolve the precipitates, may be used. When the temperature of the constituent containing an oxidizing agent is increased to 40° C. or more, the oxidizing agent may decompose. Therefore, it is preferable that the temperature after mixing the heated constituent and the constituent containing the oxidizing agent, which cools the heated constituent, is adjusted to 40° C. or less.

Alternatively, the components of the metal-polishing liquid are separated into at least two constituents. In this case, it is preferable that the components are separated into at least a constituent containing an oxidizing agent and a constituent containing an acid. Alternatively again, the metal-polishing liquid may be a concentrated liquid, and the metal-polishing liquid and water for dilution may be separately supplied to a surface to be polished.

The target to be polished by the polishing method of the invention is a substrate having: a barrier metal film formed on the entire surface of an interlayer insulating film having a concave portion; and a conductor film consisting of copper or a copper alloy formed so as to fill the concave portion at the surface of the barrier metal film. This substrate is a semiconductor substrate, and is preferably an LSI having a wiring consisting of copper and/or a copper alloy, and particularly preferably the wiring is a copper alloy.

Examples of the material to be polished include materials at any stage in semiconductor device production processes which need to be planarized, such as a wafer having an electroconductive film formed on a support substrate or a laminate having an electroconductive material film formed on an interlayer insulating film arranged on wirings formed on a support substrate.

The material to be polished is more preferably a copper alloy, still more preferably a copper alloy containing silver. The amount of silver in the copper alloy is preferably 40% by mass or less, more preferably 10% by mass or less, and still more preferably 1% by mass or less. The polishing liquid of the invention exhibits the most excellent effect on a copper alloy containing silver in the range from 0.00001 to 0.1% by mass.

In the invention, the semiconductor substrate to be polished is preferably an LSI having wiring lines with a half pitch of 0.15 µm or less, more preferably 0.10 µm or less and further preferably 0.08 µm or less in DRAM devices, or an LSI having wiring lines with a half pitch of 0.12 µm or less, 0.09 µm or less and further preferably 0.07 µm or less in MPU devices. The metal-polishing liquid of the invention exhibits a particularly excellent effect for these LSIs.

Substrate

Examples of the substrate used in the invention include substrates used in a process for manufacturing 8- or 12-inch semiconductor wafers or in a process for manufacturing macro-machines. Other examples of the substrate include semiconductor silicon wafers, SOI wafers, and sapphire substrates for compound semiconductors used in semiconductor lasers and the like. The polishing method according to the invention is also used for planarizing wiring patterns formed on a polymer film substrate.

The wafer to be subjected to CMP with the metal-polishing liquid of the invention preferably has a diameter of 200 mm or more, and particularly preferably 300 mm or more. When the diameter is 300 mm or more, the effect of the invention is significantly exhibited.

Interlayer Insulating Film

An interlayer insulating film in the invention is preferably a film having the dielectric constant of 2.6 or less, and examples thereof include silicon films and organic interlayer insulating films. In particular, carbon-doped silica films are preferably used. A thickness of an interlayer insulating film in the invention may be appropriately adjusted depending on an upper portion or a lower portion of wirings in a multi-layer wiring or between generations (nodes).

Barrier Metal Film

The barrier metal film is a film (layer) that prevents diffusion of copper, which is provided between a conductor film (wiring) consisting of a copper metal or a copper alloy on a semiconductor substrate and an interlayer insulating film.

The material for the barrier layer film is preferably a metal material having a low electric resistance and specifically preferably contains at least one selected from the group consisting of tantalum or tantalum compounds, titanium or titanium compounds, tungsten or tungsten compounds, and ruthenium, and more preferably contains TiN, TiW, Ta, TaN, W, WN or Ru, among which Ta or TaN are particularly preferred.

The thickness of the barrier metal film is preferably from about 20 nm to about 30 nm.

Hereinafter, the exemplary embodiments of the invention will be described.

(1) A liquid for polishing a metal, including:
colloidal silica particles having an average primary particle size of from 10 nm to 25 nm and an average secondary particle size of from 50 nm to 70 nm;
a metal anticorrosive agent;
at least one compound selected from the group consisting of a surfactant and a water-soluble polymer compound;
an oxidizing agent; and
an organic acid,
wherein the polishing liquid is used for chemically and mechanically polishing a conductor film including copper or a copper alloy during production of a semiconductor device.

(2) The liquid for polishing a metal according to (1), wherein the polishing liquid is diluted with water or an aqueous solution before use in polishing.

(3) The liquid for polishing a metal according to (1), wherein the metal anticorrosive agent is a benzotriazole derivative represented by the following Formula (I):

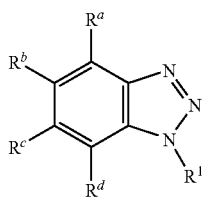

(I)

wherein, in Formula (I), $R^1$ represents a hydrogen atom or an alkyl group having 1 to 10 carbon atoms; and $R^a$, $R^b$, $R^c$ and $R^d$ independently represent a hydrogen atom or a monovalent substituent.

(4) The liquid for polishing a metal according to (3), wherein in Formula (I), the monovalent substituent is selected from the group consisting of an alkyl group having 1 to 8 carbon atoms, an amino group, a carboxyl group, a sulfo group, a carbamoyl group and an amido group.

(5) The liquid for polishing a metal according to (3), wherein the benzotriazole derivative is at least one selected from 1-(1,2-dicarboxyethyl)benzotriazole, 1-(2,3-dihydroxypropyl)benzotriazole, 1-[N,N-bis(hydroxydiethyl)aminomethyl]-benzotriazole, or 1-(hydroxymethyl)benzotriazole.

(6) The liquid for polishing a metal according to (3), wherein the metal anticorrosive agent further includes a 5-membered heterocyclic compound in combination with the benzotriazole derivative represented by Formula (I).

(7) The liquid for polishing a metal according to (3), wherein the metal anticorrosive agent further includes a compound represented by the following Formula (II) in combination with the benzotriazole derivative represented by Formula (I):

$$X^1\text{-}L\text{-}X^2 \qquad (II)$$

wherein, in Formula (II), $X^1$ and $X^2$ independently represent a heterocycle containing at least one nitrogen atom, and L represents a divalent linking group.

(8) The liquid for polishing a metal according to (1), wherein the surfactant is at least one selected from the group consisting of a carboxylate surfactant having a polyoxyethylene group, a sulfonate surfactant, a phosphate surfactant, a sulfate surfactant, and $R^2$—C≡C—$R^3$ in which $R^2$ and $R^3$ each represent an alkyl group having a substituent, and wherein the metal-polishing liquid is used in a second polishing process during the production of a semiconductor device, in which a semiconductor film including copper or a copper alloy is polished to an extent that a barrier metal film is exposed.

(9) The liquid for polishing a metal according to (1), wherein the water-soluble polymer compound is a polyvinyl alcohol having a weight average molecular weight of from 20,000 to 400,000.

(10) The liquid for polishing a metal according to (1), wherein the oxidizing agent is hydrogen peroxide, a peroxide, a nitrate, an iodate, a periodate, a hypochlorite, a chlorite, a chlorate, a perchlorate, a persulfate, a dichromate, a permanganate, ozone water, a silver (II) salt, or an iron (III) salt.

(11) The liquid for polishing a metal according to (1), wherein the organic acid is a water-soluble organic acid or a water-soluble amino acid.

(12) The liquid for polishing a metal according to claim 2, wherein the pH of the metal-polishing liquid is from 3 to 10.

(13) A method of chemically and mechanically polishing a conductor film including copper or a copper alloy in production of a semiconductor device, the method including using a liquid for polishing a metal which includes:

colloidal silica particles having an average primary particle size of from 10 nm to 25 nm and an average secondary particle size of from 50 nm to 70 nm;

a metal anticorrosive agent;

at least one compound selected from the group consisting of a surfactant and a water-soluble polymer compound;

an oxidizing agent; and an organic acid.

All publications, patent applications, and technical standards mentioned in this specification are herein incorporated by reference to the same extent as if each individual publication, patent application, or technical standard was specifically and individually indicated to be incorporated by reference.

EXAMPLES

Hereinafter, the invention is described with reference to the Examples. However, the invention is not limited to these examples. The term "wt %" as used hereinafter refers to "% by mass".

Preparation of Metal-Polishing Liquid

Example 1

(a) Specific colloidal silica (trade name: PL-2H, manufactured by Fuso Chemical Co., Ltd.): 0.010 wt %

(b) Metal anticorrosive agent (1-(1,2-dicarboxyethyl)benzothiazole): 0.050 wt %

(c) Surfactant (or a water-soluble polymer compound) (name: polyoxyethylene alkyl ether): 0.1 wt %

(d) Oxidizing agent (hydrogen peroxide solution): 1.0 wt %

(e) Organic acid (glycine): 1.0 wt %

The components (a) to (e) were added to water so that the total amount of the mixture reaches 100%, and then mixed and stirred. Then, the pH of the mixture was adjusted to 6.0 with ammonia gas.

Examples 2 to 12 and Comparative Examples 1 to 7

Metal-polishing liquids of Examples 2 to 12 and Comparative Examples 1 to 7 were prepared in the same manner as in Example 1 except that the composition in Example 1 was changed to the compositions shown in Tables 1-1 to 1-3 with respect to the particle size of colloidal silica, the metal anticorrosive agent, the surfactant or the water-soluble polymer compound, the oxidizing agent, and the organic acid. Then, resultant metal-polishing liquids were examined by the polishing test described below. The pH of the resultant metal-polishing liquids was the same as in Example 1.

In Tables 1-1 to 1-3, the oxidizing agent APS is ammonium peroxodisulfate.

The results of the polishing test are shown in Tables 1-1 to 1-3.

TABLE 1-1

| | Colloidal Silica Particle Size (nm) | | | | | | | |
|---|---|---|---|---|---|---|---|---|
| | Primary Particle Size | Secondary Particle Size | Metal Anticorrosive Agent | Surfactant/Water-Soluble Polymer | Oxidizing Agent | Organic Acid | Copper Polishing rate (nm/min) | Dishing (nm) |
| Example 1 | 15 | 50 | 1-(1,2-dicarboxyethyl) benzotriazole | polyoxyethylene alkyl ether phosphate | APS | glycine | 355 | 50 |
| Example 2 | 15 | 50 | 1-(2,3-dihydroxypropyl)-benzotriazole | polyoxyethylene alkyl phenyl phosphate | APS | glycine | 385 | 55 |
| Example 3 | 15 | 50 | 1-[N,N-bis(hydroxy diethyl)aminomethyl]-benzotriazole | polyoxyethylene alkyl ether acetate | APS | α-alanine | 425 | 50 |
| Example 4 | 20 | 50 | 1-(hydroxymethyl) benzotriazole | polyoxyethylene alkyl phenyl phosphate | hydrogen peroxide | glycine | 620 | 45 |
| Example 5 | 20 | 50 | 1-(1,2-dicarboxyethyl) benzotriazole | pullulan | hydrogen peroxide | glycine | 435 | 50 |
| Example 6 | 25 | 70 | 1-(1,2-dicarboxyethyl) benzotriazole | polyvinyl alcohol | APS | α-alanine | 505 | 55 |

TABLE 1-2

| | Colloidal Silica Particle Size (nm) | | | | | | | |
|---|---|---|---|---|---|---|---|---|
| | Primary Particle Size | Secondary Particle Size | Metal Anticorrosive Agent | Surfactant/Water-Soluble Polymer | Oxidizing Agent | Organic Acid | Copper Polishing rate (nm/min) | Dishing (nm) |
| Example 7 | 25 | 70 | 1-(1,2-dicarboxy ethyl)benzotriazole | coconut oil fatty acid sarcosine triethanolamine | APS | glycine | 370 | 65 |
| Example 8 | 25 | 70 | 1-(1,2-dicarboxy ethyl)benzotriazole | dodecylbenzene sulfonic acid | APS | glycine | 410 | 50 |
| Example 9 | 25 | 70 | 1-(2,3-dihydroxy propyl)benzotriazole | coconut oil fatty acid methyl taurine sodium | hydrogen peroxide | α-alanine | 450 | 65 |
| Example 10 | 25 | 70 | 1-(2,3-dihydroxy propyl)benzotriazole | sodium dioctylsulfo succinate | APS | glycine | 410 | 50 |
| Example 11 | 12 | 67 | 1-(hydroxymethyl) benzotriazole | polyoxyethylene alkyl ether acetate | hydrogen peroxide | sarcosine | 390 | 50 |
| Example 12 | 22 | 65 | 1-(hydroxymethyl) benzotriazole | polyoxyethylene alkyl ether acetate | hydrogen peroxide | sarcosine | 380 | 60 |

TABLE 1-3

| | Colloidal Silica Particle Size (nm) | | | | | | | |
|---|---|---|---|---|---|---|---|---|
| | Primary Particle Size | Secondary Particle Size | Metal Anticorrosive Agent | Surfactant/Water-Soluble Polymer | Oxidizing Agent | Organic Acid | Copper Polishing rate (nm/min) | Dishing (nm) |
| Comparative example 1 | 25 | 50 | benzotriazole | coconut oil fatty acid methyl taurine sodium | APS | — | 650 | 130 |
| Comparative example 2 | 120 | 200 | 1-(1,2-dicarboxyethyl) benzotriazole | polyoxyethylene alkyl phenyl phosphate | hydrogen peroxide | glycine | 750 | 125 |
| Comparative example 3 | 12 | 45 | 1-(1,2-dicarboxyethyl) benzotriazole | polyoxyethylene alkyl ether acetate | APS | glycine | 200 | 100 |
| Comparative example 4 | 8 | 75 | 1-(2,3-dihydroxy propyl)benzotriazole | coconut fatty acid methyl taurine sodium | APS | glycine | 550 | 95 |

TABLE 1-3-continued

| | Colloidal Silica Particle Size (nm) | | | | | | | |
|---|---|---|---|---|---|---|---|---|
| | Primary Particle Size | Secondary Particle Size | Metal Anticorrosive Agent | Surfactant/Water-Soluble Polymer | Oxidizing Agent | Organic Acid | Copper Polishing rate (nm/min) | Dishing (nm) |
| Comparative example 5 | 28 | 55 | 1-(2,3-dihydroxy propyl)benzotriazole | polyoxyethylene alkyl ether acetate | hydrogen peroxide | glycine | 530 | 85 |
| Comparative example 6 | 28 | 75 | 1-(hydroxymethyl) benzotriazole | polyoxyethylene alkyl phenyl phosphate | hydrogen peroxide | sarcosine | 550 | 230 |
| Comparative example 7 | 25 | 70 | — | polyoxyethylene alkyl ether acetate | hydrogen peroxide | sarcosine | 660 | 210 |

Evaluation of Polishing Rate

As a polishing apparatus, FREX-300 (trade name, manufactured by Ebara Corporation) was used to polish a film arranged on each wafer while the slurry was supplied thereto under the following conditions, and the polishing rate was calculated.

Platen: silicon wafer having 12-inch copper film
Revolutions of the table: 104 rpm
Revolutions of the head: 105 rpm (processing linear velocity =1.0 m/s)
Polishing pressure: 10.5 kPa
Polishing pad: IC-1400 (trade name, manufactured by Rohm & Haas Co.) (K-grv)+(A21)
Slurry supply rate: 200 ml/min.

The polishing rate was calculated by converting electrical resistance values before and after polishing into the film thickness of the copper film or the barrier film. Specifically, the polishing rate was calculated in accordance with the following equation.

Polishing rate (nm/min)=(thickness of copper film or barrier film before polishing−thickness of copper film or barrier film after polishing)/polishing time Evaluation of Dishing As a polishing apparatus, FREX-300 (trade name; manufactured by Ebara Corporation) was used to polish a film arranged on each wafer on which a pattern had been formed while the slurry was supplied under the following conditions, and unevenness of the film surface was measured.

Platen: A 12-inch wafer was used. The wafer was formed as follows: a silicon oxide film was subjected to patterning by a photolithography step and a reactive ion etching step to form via-holes and wiring trenches having a width of from 0.09 to 100 μm and a depth of 600 nm, a 20 nm thick Ta film was further formed thereon by a sputtering method, a 50 nm thick copper film was subsequently formed by a sputtering method, and a total thickness of 1,000 nm of copper film was then formed by a plating method, thereby producing the intended 12-inch wafer.
Revolutions of the table: 50 rpm
Revolutions of the head: 50 rpm
Polishing pressure: 10.5 kPa
Polishing pad: IC-1400 (trade name, manufactured by Rodel Nitta)
Slurry supply rate: 200 ml/min.

As shown in Tables 1-1 to 1-3, it can be seen that the polishing rate of copper is large and dishing is little in the Examples in which the colloidal silica having the controlled average primary particle size and average secondary particle size was used in combination with the metal anticorrosive agent, the surfactant or the water-soluble polymer compound, the oxidizing agent and the organic acid according to the invention. In contrast, it can be seen that in the Comparative Examples lacking in the requirement of the invention, dishing is significant and the polished surface has poor planarity even when a high polishing rate is obtained.

What is claimed is:

1. A liquid for polishing a metal, comprising:
polishing particles consisting of colloidal silica particles having an average primary particle size of from 10 nm to 25 nm and having an average secondary particle size, of aggregates of the colloidal silica particles, of from 50 nm to 70 nm;
a metal anticorrosive agent comprising a benzotriazole derivative that comprises at least one selected from the group consisting of 1-(1,2-dicarboxyethyl)benzotriazole, 1-(2,3-dihydroxypropyl)benzotriazole, 1-[N,N-bis(hydroxydiethyl)aminomethyl]-benzotriazole, and 1-(hydroxymethyl)benzotriazole;
at least one compound selected from the group consisting of a surfactant and a water-soluble polymer compound;
an oxidizing agent; and
an organic acid,
wherein the polishing liquid is for chemically and mechanically polishing a conductor film comprising copper or a copper alloy during production of a semiconductor device and wherein a pH of the polishing liquid is from 6 to 8.

2. The liquid for polishing a metal according to claim 1, wherein the polishing liquid is diluted with water or an aqueous solution.

3. The liquid for polishing a metal according to claim 1, wherein the metal anticorrosive agent further comprises a 5-membered heterocyclic compound in combination with the benzotriazole derivative.

4. The liquid for polishing a metal according to claim 1, wherein the metal anticorrosive agent further comprises a compound represented by the following Formula (II) in combination with the benzotriazole derivative:

X-L-X  (II)

wherein, in Formula (II), $X^1$ and $X^2$ independently represent a heterocycle containing at least one nitrogen atom, and L represents a divalent linking group.

5. The liquid for polishing a metal according to claim 1, wherein the surfactant comprises at least one selected from the group consisting of a carboxylate surfactant having a polyoxyethylene group, a sulfonate surfactant, a phosphate surfactant, a sulfate surfactant, and $R^2$—C≡C—$R^3$ in which $R^2$ and $R^3$ each represent an alkyl group having a substituent, and wherein the polishing liquid is for a second polishing process during the production of a semiconductor device, in which a semiconductor film comprising copper or a copper alloy is polished to an extent that a barrier metal film is exposed.

6. The liquid for polishing a metal according to claim 1, wherein the water-soluble polymer compound comprises a polyvinyl alcohol having a weight average molecular weight of from 20,000 to 400,000.

7. The liquid for polishing a metal according to claim 1, wherein the oxidizing agent comprises hydrogen peroxide, a peroxide, a nitrate, an iodate, a periodate, a hypochlorite, a chlorite, a chlorate, a perchlorate, a persulfate, a dichromate, a permanganate, ozone water, a silver (II) salt, or an iron (III) salt.

8. The liquid for polishing a metal according to claim 1, wherein the organic acid comprises a water-soluble organic acid or a water-soluble amino acid.

9. The liquid for polishing a metal according to claim 4, wherein, in Formula (II), L is a divalent linking group selected from the group consisting of (L-1) through (L-15), below:

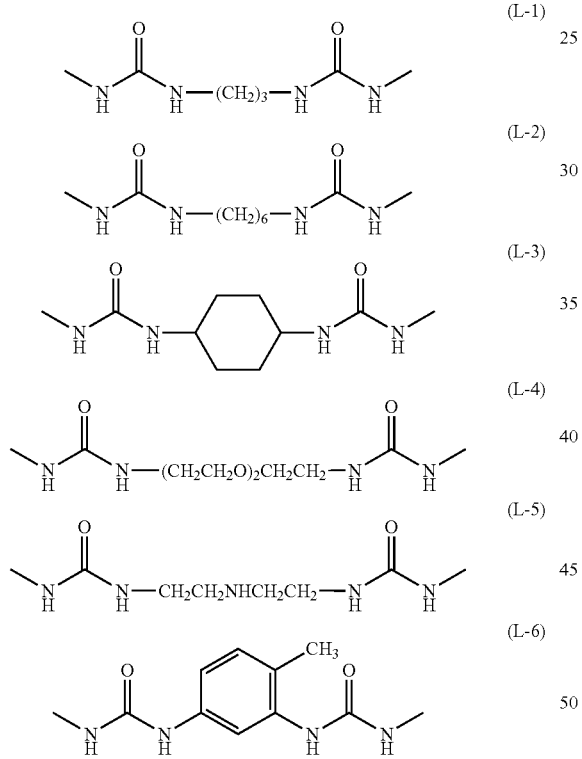

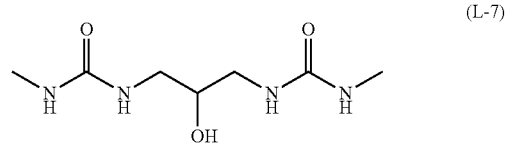

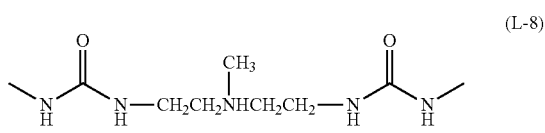

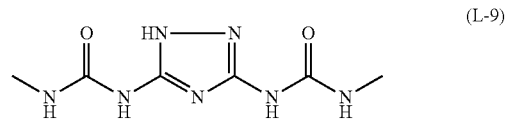

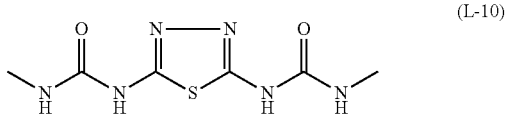

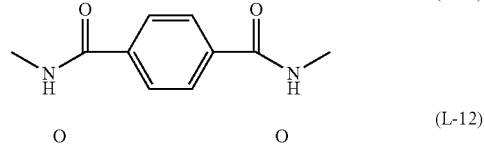

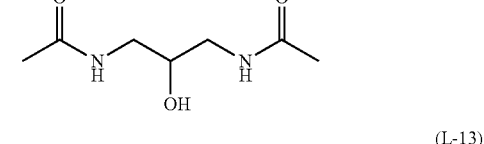

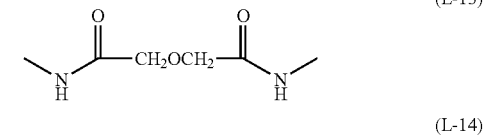

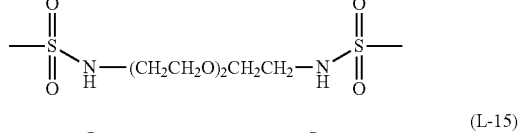

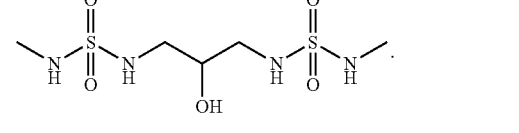

* * * * *